United States Patent
Fisher

(10) Patent No.: US 6,784,073 B1
(45) Date of Patent: Aug. 31, 2004

(54) METHOD OF MAKING SEMICONDUCTOR-ON-INSULATOR DEVICE WITH THERMOELECTRIC COOLER

(75) Inventor: Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/704,508

(22) Filed: Nov. 7, 2003

Related U.S. Application Data

(62) Division of application No. 10/135,008, filed on Apr. 29, 2002, now Pat. No. 6,674,128.
(60) Provisional application No. 60/286,876, filed on Apr. 27, 2001.

(51) Int. Cl.[7] .............................................. H01L 21/76
(52) U.S. Cl. ...................................... 438/404; 438/311
(58) Field of Search ................................ 438/404, 311, 438/694, 749, 753

(56) References Cited

U.S. PATENT DOCUMENTS

| | | | |
|---|---|---|---|
| 5,229,327 A | 7/1993 | Farnworth | 438/122 |
| 5,955,781 A | 9/1999 | Joshi et al. | 257/712 |
| 5,956,569 A | 9/1999 | Shiu et al. | 438/48 |
| 6,034,408 A | 3/2000 | Ghoshal | 257/467 |
| 6,222,113 B1 * | 4/2001 | Ghoshal | 136/201 |
| 6,288,426 B1 | 9/2001 | Gauthier, Jr. et al. | 257/347 |
| 6,452,232 B1 | 9/2002 | Adan | 257/347 |

* cited by examiner

Primary Examiner—Craig A. Thompson
(74) Attorney, Agent, or Firm—Renner, Otto, Boisselle & Sklar, LLP

(57) ABSTRACT

A semiconductor-on-insulator (SOI) device includes a thermoelectric cooler on a back side of the device. The thermoelectric cooler is formed on a thinned portion of a deep bulk semiconductor layer of the SOI device. The thermoelectric device includes a plurality of pairs of opposite conductivity semiconductor material blocks formed on a metal layer deposited on the thinned portion. The thinning of the thinned portion may be accomplished in multiple etching steps of the deep silicon layer, such as a fast etching down to an etch stop and a slower, more controlled etch to the desired thickness for the thinned portion.

19 Claims, 3 Drawing Sheets

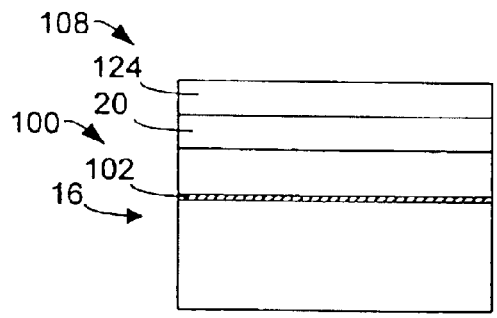
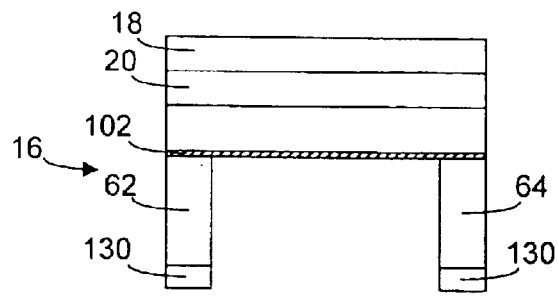
Fig. 4
Fig. 5
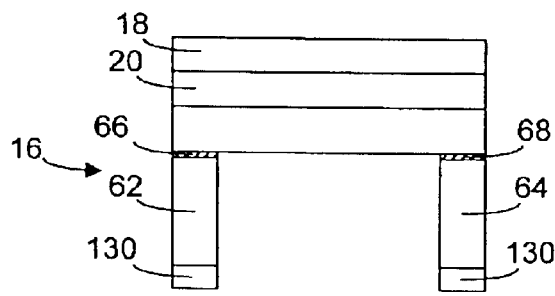
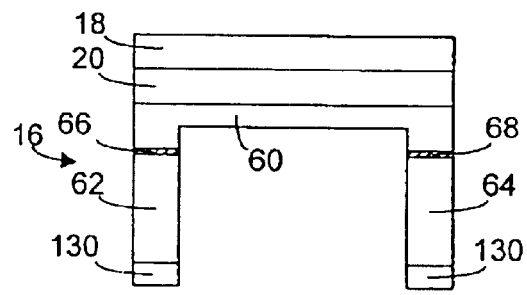
Fig. 6
Fig. 7
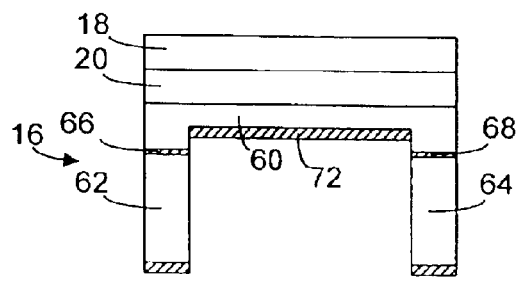
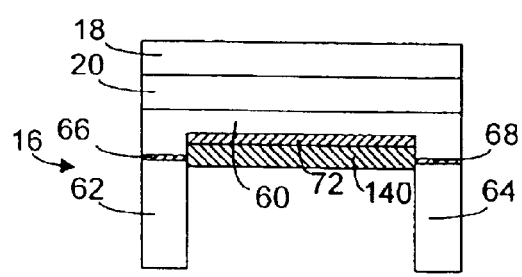
Fig. 8
Fig. 9

METHOD OF MAKING SEMICONDUCTOR-ON-INSULATOR DEVICE WITH THERMOELECTRIC COOLER

This application is a division of U.S. application Ser. No. 10/135,008, filed Apr. 29, 2002, now U.S. Pat. No. 6,674,128 which claims priority under 35 USC 119(e) from U.S. Provisional Application Ser. No. 60/286,876, filed Apr. 27, 2001. Both of the above applications are herein incorporated by reference in their entireties.

BACKGROUND OF THE INVENTION

1. Field of Invention

The present invention relates to semiconductor-on-insulator devices and methods of making, and in particular to structures and/or methods of cooling such devices.

2. Description of the Related Art

Semiconductor devices, such as devices including transistors, for example, produce heat. As device density increases, the problem of removing the heat created by operation of the devices intensifies.

SUMMARY OF THE INVENTION

A semiconductor-on-insulator (SOI) device includes a thermoelectric cooler on a back side of the device. The thermoelectric cooler is formed on a thinned portion of a deep bulk semiconductor layer of the SOI device. The thermoelectric device includes a plurality of pairs of opposite conductivity semiconductor material blocks formed on a metal layer deposited on the thinned portion. The thinning of the thinned portion may be accomplished in multiple etching steps of the deep silicon layer, such as a fast etching down to an etch stop and a slower, more controlled etch to the desired thickness for the thinned portion.

According to an aspect of the invention, a semiconductor device includes a surface semiconductor layer; a buried insulator layer below the surface semiconductor layer and in contact with the surface semiconductor layer; a deep semiconductor layer having a upper surface in contact with the buried insulator layer, the deep semiconductor layer having a thinned portion, the thinned portion having a back surface which is opposite the upper surface; and a thermoelectric cooler on the back surface of the thinned portion.

According to another aspect of the invention, a semiconductor device includes a surface semiconductor layer; a buried insulator layer below the surface semiconductor layer and in contact with the surface semiconductor layer; a deep semiconductor layer having a upper surface in contact with the buried insulator layer, the deep semiconductor layer having a thinned portion, the thinned portion having a back surface which is opposite the upper surface; and cooling means on the back surface of the thinned portion.

According to yet another aspect of the invention, a method of making a semiconductor device includes the steps of: providing a semiconductor-on-insulator (SOI) wafer having a surface semiconductor layer and a bulk semiconductor layer with a buried insulator layer therebetween; thinning at least a portion of the bulk semiconductor layer of the SOI wafer, thereby producing a thinned portion of the bulk semiconductor layer; and forming a thermoelectric cooler on a back side of the thinned portion of the bulk semiconductor layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIGS. 2-11 are side cross-sectional schematic views illustrating some of the steps of a method of fabricating the device of FIG. 1.

DETAILED DESCRIPTION

A semiconductor-on-insulator (SOI) device includes a thermoelectric cooler. The thermoelectric cooler is located on the back side of the SOI device, on a thinned portion of the deep bulk semiconductor layer. The thermoelectric cooler includes a metal layer, and pairs of oppositely-doped semiconductor material blocks operatively coupled to provide a cooling effect when a current is applied across them. The cooler may be fabricated by creating the thinned portion by one or more etches, and forming the metal layer and the semiconductor blocks on the thinned portion.

Figure 1:
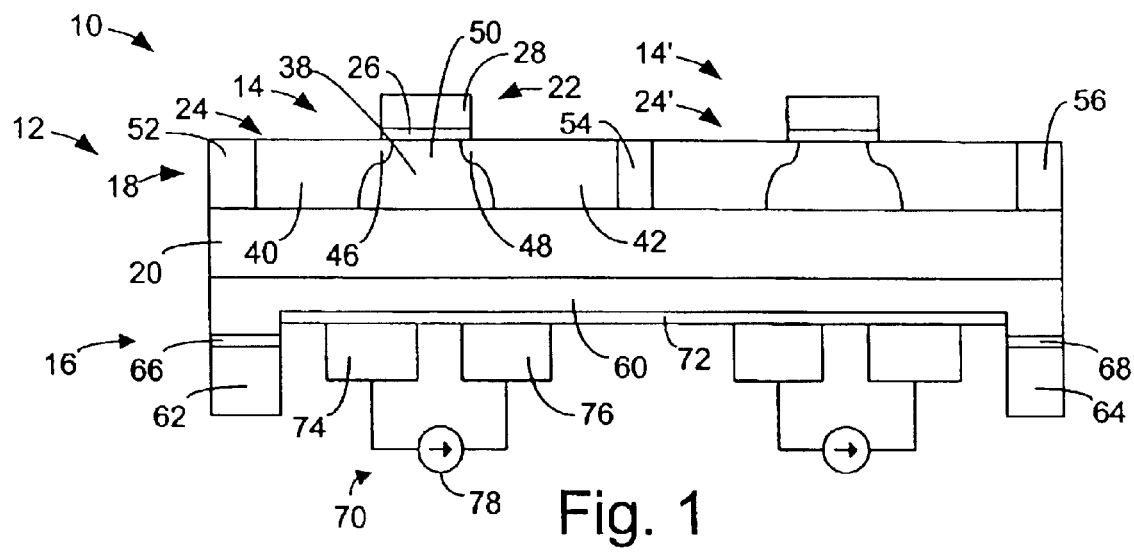
FIG. 1 is a side cross-sectional schematic view of a semiconductor device formed in accordance with the present invention.

Referring initially to FIG. 1, a semiconductor device 10 includes an SOI wafer 12 with transistors 14 and 14' formed thereupon. The SOI wafer 12 includes a semiconductor substrate 16 (also referred to as a deep semiconductor material layer) and a surface semiconductor layer 18, with a buried insulator layer 20 therebetween. As is conventional, the semiconductor substrate 16 and the surface semiconductor layer 18 may be made of silicon and the buried insulator layer 20 may include a silicon oxide such as $SiO_2$, although it will be appreciated that other suitable materials may be used instead or in addition.

The transistors 14 and 14' are of conventional design. For example, the transistor 14 includes a gate 22 formed on an active semiconductor region 24 of the surface semiconductor layer 18. The gate 22 includes a gate dielectric 26 and a gate electrode 28. Exemplary materials for the gate dielectric 26 are $SiO_2$. and $SiO_xN_y$, or stacks thereof. The gate electrode 28 may be made of polysilicon or another semiconductor, or may be made in whole or in part of metal.

The active region 24 includes a body 38, with a source 40 and a drain 42 on respective opposite sides of the body. The source 40 and the drain 42 have respective source and drain extensions 46 and 48. The body includes a channel 50 between the source 40 and the drain 42 along the underside of the gate dielectric 26. The body 38 may be of P-conductivity semiconductor material while the source 40 and the drain 42 may be of N-conductivity semiconductor material. Alternatively, the body 38 may be of N-conductivity semiconductor material while the source 40 and the drain 42 may be of P-conductivity semiconductor material. Typical dopant materials for achieving N-type conductivity include P, As, and Sb. Typical dopant materials for achieving P-type conductivity include Al, Ga, B, $BF_2$, and In. Some of the dopants may be placed in the active layer 24 when the layer or semiconductor material is formed. Alternatively or in addition, the dopants for one or more of the regions may be added in a later processing step, such as in one or more implanting operations.

The source 40, the drain 42, and the channel 50, are operatively coupled with the gate 22 to function as a transistor. The source 40 and the drain 42 have respective source and drain electrically-conducting compound regions (also referred to as "silicide regions"), to facilitate electrical connection to the source and drain. The gate electrode 28 likewise may include an upper conductive portion to facilitate electrical connection.

The active region 24 is laterally isolated from other structures of the device 10 by insulator-filled trenches 52 and 54 on opposite sides of the active region. The insulator-filled trenches 52 and 54 may be trenches filled with silicon dioxide ($SiO_2$), produced using known shallow trench isolation (STI) techniques. It will be appreciated that other suitable isolation structures and/or techniques may be used alternatively or in addition.

The transistor 14' may have similar structures to those of the transistor 14 described above. An active region 24' of the transistor 14' is laterally isolated from other structures by insulator-filled trenches 54 and 56 on opposite sides of the active region 24'.

The semiconductor substrate 16 includes a thinned portion 60 underlying the transistors 14 and 14', and unthinned portions 62 and 64 bounding the thinned portion 60. A thermoelectric cooler 70 is formed on the thinned portion 60. The relative thinness of the thinned portion 60 decreases the thermal resistance between the thermoelectric cooler 70 and the heat-producing transistors 14 and 14'. Thus by thinning the portion 60 of the semiconductor substrate 16 on which the thermoelectric cooler 70 is placed, the ability of the thermoelectric cooler to effectively remove heat is enhanced. The unthinned portions 62 and 64 may be retained unthinned in order to maintain the structural integrity of the device 10, which may otherwise become fragile if the semiconductor substrate 16 is uniformly thinned.

The thickness of the thinned portion 60 may be about 10 $\mu$m or less, may be about 5 $\mu$m or less, or may be about 1 $\mu$m or less. Alternatively, the combined thickness of the thinned portion 60 and the buried insulator layer may be about 10 $\mu$m or less, may be about 5 $\mu$m or less, or may be about 1 $\mu$m or less. A certain minimum thickness of the thinned portion 60 may be desirable in order to maintain the ability to pass electrical signals therethrough, for example in utilizing the thinned portion 60 for grounding portions of the transistors 14 and 14'. The surface area of the thinned portion 60 may be sufficient to underlie a large number of devices such as the transistors 14 and 14'. For example, the thinned portion 60 may have a surface area of about 5 mm×5 mm.

The unthinned portions 62 and 64 include respective etch stop elements 66 and 68, which are remnants of an etch stop layer which may be used in thinning the thinned portion 60 of the semiconductor substrate 16, as described further below. The etch stop elements may include a semiconductor nitride, such as silicon nitride.

The thermoelectric cooler 70 includes a metal layer 72 and a pair of semiconductor material blocks 74 and 76 operatively coupled together via a current source 78. The pair of semiconductor material blocks 74 and 76. and the current source 78, are but one of a plurality of such devices on the metal layer 72.

The semiconductor material blocks 74 and 76 have opposite conductivity from one another, one of the blocks having N-type conductivity and the other having P-type conductivity. The blocks 74 and 76 and the current source 78 are configured in conjunction with the metal layer 72 such that when current is passed through the circuit made by the blocks and the metal layer, a cooling occurs in the metal layer. This is due to the well-known Peltier effect.

The metal layer 72 may have a thickness from about 0.5 $\mu$m to about 50 $\mu$m, or may have a thickness from about 1 $\mu$m to about 10 $\mu$m. The metal layer may include tungsten or other suitable materials. The blocks 74 and 76 may have a width of from 1 $\mu$m to 100 $\mu$m, may have a width of from 1 $\mu$m to 10 $\mu$m, or may have a width of from 10 $\mu$m to 100 $\mu$m.

It will be appreciated that the pairs of semiconductor material blocks may be linked together so as to have a single current source provide energy multiple pairs of semiconductor blocks.

Thus the thermoelectric cooler 70 may provide localized cooling the area of the transistors 14 and 14', thus improving transistor operation and reducing likelihood of heat-induced failure of the semiconductor device 10.

The semiconductor device 10 shown in FIG. 1 and described above is but one example of semiconductor devices that may be produced with built-in thermoelectric coolers. It will be appreciated that many variants are possible. For example, the device may include a wide variety of NMOS and PMOS transistors in any of various configurations. Other semiconductor elements may be present.

Figure 2:
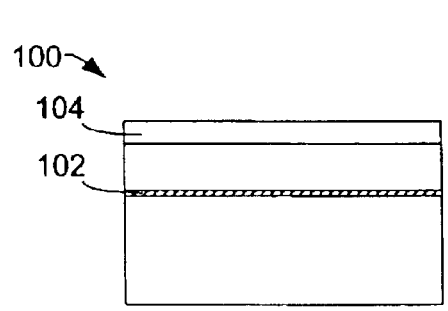

FIGS. 2-11 schematically illustrate various steps involved in a process of making the semiconductor device 10 shown in FIG. 1 and described above. Referring to FIG. 2, starting initially with a semiconductor wafer 100, a buried etch stop layer 102 is formed, followed by formation of a surface oxide layer 104. The etch stop layer 102 may be formed by implanting a suitable material, such as a nitrogen-containing material, into the semiconductor wafer 100. It will be appreciated that the depth of the etch stop layer 102 may be controlled by controlling the energy of the implanted ions.

The surface oxide layer 104 may be formed by exposing the semiconductor wafer 100 to an oxygen-containing atmosphere at an elevated temperature, as is well known.

Figure 3:
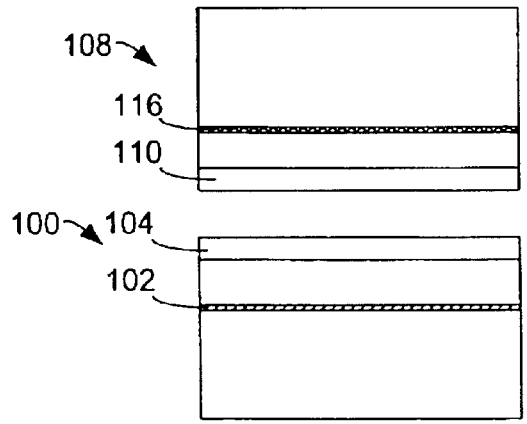

Referring now to FIGS. 3 and 4, a semiconductor wafer 108 is joined to the semiconductor wafer 100. The semiconductor wafer 108 has an oxide layer 110 which may be formed in a manner similar to the oxide layer 104 on the semiconductor wafer 100. The wafer 108 also has a weakened zone 116 (FIG. 3) is created in the semiconductor wafer 108. The weakened zone 116 may be created by conventional methods, such as by a hydrogen implant in the wafer 108. It will be appreciated that the weakened zone 116 may be created by other suitable methods.

As is conventional in SOI fabrication processes, the oxide layers 104 and 110 of the wafers may be joined by pressing them together in a suitable atmosphere, such as an oxygen-containing atmosphere. Then the wafer 108 is broken along the weakened zone 116. The breaking may be accomplished by a variety of suitable well-known means, such as by use of heat or mechanical pressure. A remaining part 124 of the wafer 108 is then polished, such as by conventional chemical-mechanical polishing techniques. Following polishing, the device may be heated to fuse the oxide layers 104 and 110 together, thereby forming the SOI wafer 12 with the unitary buried insulator layer 20.

Turning now to FIG. 5, portions of the bottom surface of the deep semiconductor material layer 16 are covered with mask elements 130. The mask elements protect the underlying portions (the unthinned portions 62 and 64) of the deep semiconductor material layer 16 during etching processes to form the thinned portion 60. The mask elements 130 may be formed using well-known lithographic techniques.

As illustrated in FIG. 5, a first etch (fast etch) is performed to remove unprotected material from the deep semiconductor material layer 16 down to the level of the etch stop layer 102. A typical etchant for such as a fast etch is a mixture of $HNO_3$, $H_2O$, and HF. It will be appreciated that a wide variety of suitable wet and dry etchants and etching methods may be used.

Then, in FIG. 6, the exposed portion of the etch stop layer 102 is removed, leaving the etch stop elements 66 and 68. The exposed portion may be removed by etching, using a suitable etchant. A well-known etchant for silicon nitride is phosphoric acid.

As shown in FIG. 7, a second etch (slow etch) of the exposed semiconductor material is then performed, to produce the thinned portion 60 with the desired thickness. The second etch of the semiconductor material may use the same etchant as the first etch in the same or a different concentration, or may use a different etchant. It will be appreciated that a wide variety of suitable wet and dry etchant materials and processes may be utilized.

It will be appreciated that the multiple etchings of the semiconductor material may be advantageous from a process control standpoint. The first etch may not require tight control of times and tolerances, and a fast-acting etchant material/method may be utilized. The second etch, which may require tight tolerances to achieve the desired thickness, is a relatively shallow etch. The second etch may therefore be able to be accomplished quickly but accurately. Thus the multiple-step etching process may facilitate achieving both fast processing and good tolerance control.

It will be appreciated that alternatively the etch stop layer 102 may be omitted, and that a single etch step may be used to form thinned portion 60. As another alternative, it will be appreciated that interferometric end point methods, in combination with a multi-step etch, may be used to devise a process with improved etch controllability. It will be appreciated that readily-available SOI wafers formed using a variety of well-known processes (such as SIMOX) may be used in such a simplified process.

Referring to FIG. 8, the metal layer 72 is then deposited on the thinned portion 60. The metal layer may be deposited by a variety of suitable methods, such as chemical vapor deposition (CVD) or sputtering. It will be appreciated that the metal deposition may also deposit metal on the unthinned portions 62 and 64, as shown in FIG. 8, and that this additional metal may be removed using any of a variety of known techniques.

Figure 10:
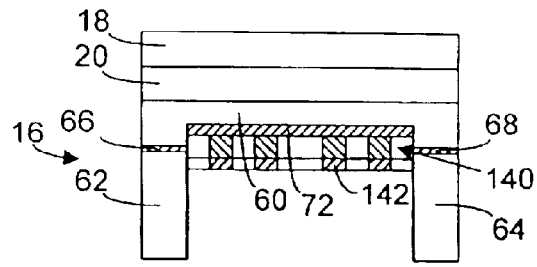

FIGS. 9 and 10 illustrate the formation of the pairs of the semiconductor material blocks. First a semiconductor material layer 140 is formed, such as by CVD or epitaxial growth (FIG. 9). Then parts of the layer 140 are selectively removed, as in by a masked etching.

An elastomer mask 142 may be placed against the semiconductor material layer 140 during the etching to protect portions of the semiconductor material layer from etching. It may be desirable to use to the elastomer mask 142 rather than more traditional resist masks. This may be because of the difficultly of performing lithographic processes on photoresist materials due to the uneven surface of the thinned portion 60 and the unthinned portions 62 and 64. The uneven surface may make it difficult to focus on resist material at the bottom of the trench in which the semiconductor material layer 140 is located.

The elastomer mask 142 may be made of a variety of suitable elastomer materials, such as rubber. It will be appreciated that well-known suitable methods may be used to form suitable openings in the elastomer mask 142 to allow etching therethrough. It will further be appreciated that the elastomer mask 142 may be other than as shown in FIG. 10. For instance the elastomer mask may extend out of the trench 150, overlying the unthinned portions 62 and 64.

It will be appreciated that other suitable methods may be utilized for selectively removing some of the semiconductor material of the semiconductor material layer 140 to form the semiconductor material blocks 74 and 76. For instance, suitable masking using patterned resist may be employed.

Figure 11:
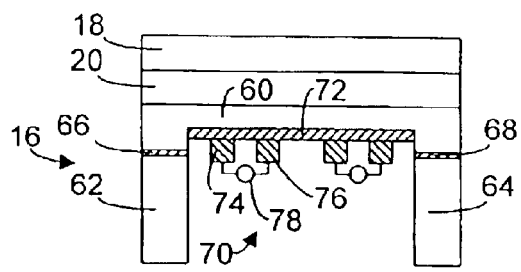

After the etching of the semiconductor material layer 140 to produce the semiconductor blocks 74 and 76, the mask 142 may removed, and the semiconductor blocks may be suitably doped so as to have opposite conductivity. Subsequently, the semiconductor blocks 74 and 76 may be operatively coupled to the current source 78, as illustrated in FIG. 11, to thereby form the thermoelectric cooler 70. The current source may be any of a variety of well-known current sources suitable for use with such thermoelectric devices.

It will be appreciated that suitable alterations may be made in the order and/or type of fabrications steps described above, as appropriate.

Although not illustrated, the transistors 14 and 14' and the insulator-filled trenches 52–56 (FIG. 1) may be formed at a suitable point in the above process, for example before the backside processing begins in FIG. 5. Such formation may include various well-known processes such as deposition, masking, etching, implanting, and annealing. It will be appreciated that some of the fabrication steps for forming the transistors 14 and 14' and the insulation-filled trenches 52–56 may be performed before and/or at the same time as the steps described earlier for the fabrication of the SOI wafer with the thermoelectric cooler 70.

Turning now to FIGS. 12-15, some steps are shown of an alternative method of producing a semiconductor device 10. The initial steps of the alternative method may involve steps such as those shown in FIGS. 2–7 and described above. As shown in FIGS. 12-15, the etch stop layer elements 66 and 68 are omitted, as may be the case when a single-step etch, without use of an etch stop layer, is used to produce the thinned portion 60 of the semiconductor substrate 16.

Figure 12:
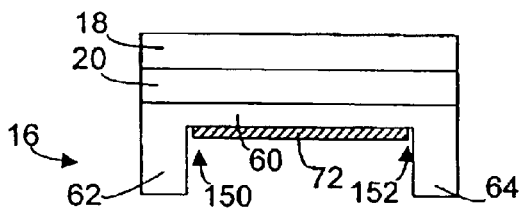
FIGS. 12-15 are side cross-sectional schematic views illustrating some of the steps of an alternative method of fabricating the device of FIG. 1.

Making reference to FIG. 12, the metal layer 72 is formed on the thinned portion 60. The metal layer 72 may be formed in a manner similar to that illustrated in FIG. 8 and described above. In addition, gaps 150 and 152 may be formed along the edges of the metal layer 72 by conventional means, such as photolithography or elastomer stamping.

Figure 13:
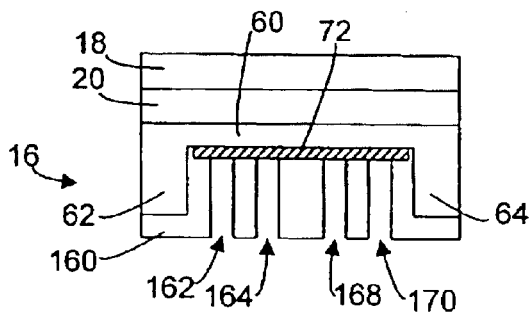

Referring to FIG. 13, a planarizing layer 160 of suitable insulating material is then deposited, and the insulating material is then suitably etched to form channels 162–170 therethrough to the metal layer 72. The channels correspond to the desired locations of semiconductor blocks, as will be described below. The etching may be accomplished by use of any of a variety of suitable etch masks, such as those described above.

Figure 14:
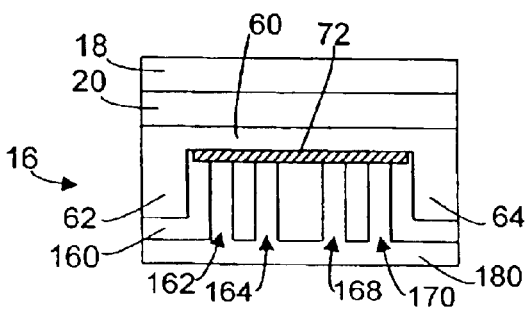

Semiconductor material 180 may then be deposited, as illustrated in FIG. 14. The depositing of the semiconductor material 180 may be accomplished by suitable deposition methods, such as those described above. The semiconductor material 180 at least in part fills the channels 162–170.

Figure 15:
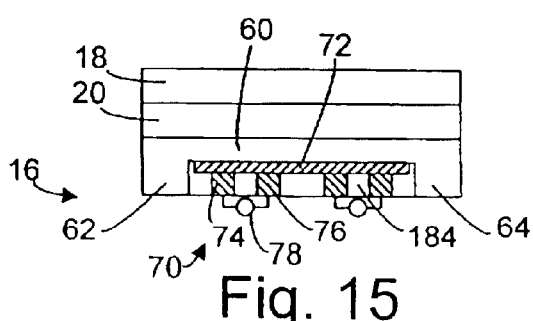

Thereafter, as shown in FIG. 15, the semiconductor material 180, the planarizing layer 160, and the substrate 16 are polished. The polishing is carried out to a suitable distance from the metal layer 72 to form semiconductor blocks such as the semiconductor blocks 74 and 76. Remaining portions of the planarizing layer 160 form blocks of insulating material, such as a block 184, between and/or around the semiconductor blocks 74 and 76. The blocks of insulating material provide insulation and increase structural integrity. The polishing may include conventional CMP methods.

Finally, suitable current sources, such as the current source 78, may be suitably coupled to the semiconductor blocks.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making a semiconductor device, comprising:

providing a semiconductor-on-insulator (SOI) wafer having a surface semiconductor layer and a bulk semiconductor layer with a buried insulator layer therebetween;

thinning at least a portion of the bulk semiconductor layer of the SOI wafer, thereby producing a thinned portion of the bulk semiconductor layer; and forming a thermoelectric cooler on a back side of the thinned portion of the bulk semiconductor layer.

2. The method of claim 1, wherein the forming the thermoelectric cooler includes:

depositing a layer of metal on the back side; and forming at least one pair of semiconductor material blocks on a second major surface of the metal layer, wherein the semiconductor material blocks have respective opposite conductivities.

3. The method of claim 2, wherein the forming the semiconductor material blocks includes:

depositing a layer of semiconductor material;

placing an elastomer mask against the layer of semiconductor material; and selectively etching the layer of semiconductor material through openings in the elastomer mask.

4. The method of claim 2, wherein the semiconductor material blocks have respective opposite conductivities.

5. The method of claim 2, wherein the metal layer has a thickness from 0.5 $\mu$m to 50 $\mu$m.

6. The method of claim 2, wherein the metal layer has a thickness from 1 $\mu$m to 10 $\mu$m.

7. The method of claim 2, wherein the metal layer includes silicon germanium.

8. The method of claim 2, wherein the forming the thermoelectric cooler further includes coupling a pair of the semiconductor material blocks to a current source.

9. The method of claim 2, wherein the forming the semiconductor material blocks includes:

depositing a layer of insulating material;

forming channels in the insulating material at desired locations for the semiconductor blocks; and depositing semiconductor material in the channels.

10. The method of claim 9, wherein the forming the channels includes uncovering portions of the metal layer.

11. The method of claim 9, wherein the forming the channels includes etching portions of the insulating material to form the channels.

12. The method of claim 9, wherein the forming further includes reducing thickness of the insulating material and the semiconductor material.

13. The method of claim 12, wherein the reducing thickness includes polishing the insulating material and the semiconductor material.

14. The method of claim 1, wherein the thinning the bulk semiconductor layer is a selective partial thinning, leaving unthinned portions of the bulk semiconductor layer.

15. The method of claim 1, wherein the thinning includes:

performing a first etch on the at least a portion of the bulk semiconductor layer, the first etch being performed down to an etch stop;

removing an exposed portion of the etch stop; and performing a second etch on the at least a portion of the bulk semiconductor layer, to thereby form the thinned portion of the bulk semiconductor layer.

16. The method of claim 15, wherein the first etch and the second etch utilize different etchants.

17. The method of claim 15, further comprising, prior to the thinning, forming the etch stop by implanting.

18. The method of claim 1, further comprising forming a transistor that is thermally coupled to the thermoelectric cooler.

19. The method of claim 18, wherein the transistor is thermally coupled to the thermoelectric cooler through a front side of the thinner portion.

* * * * *